United States Patent [19]

Andres et al.

[11] 4,174,219

[45] Nov. 13, 1979

[54] METHOD OF MAKING A NEGATIVE EXPOSURE MASK

[75] Inventors: Heinrich A. Andres, Rheinstetten; Hartmut F. Kolbe, Boeblingen; Horst Schlagdenhaufen, Grafenau; Frank A. Schwarzbach, Hildrizhausen, all of Fed. Rep. of Germany

[73] Assignee: International Business Machines Corporation, Armonk, N.Y.

[21] Appl. No.: 846,741

[22] Filed: Oct. 31, 1977

[30] Foreign Application Priority Data

Dec. 23, 1976 [DE] Fed. Rep. of Germany ....... 2658400

[51] Int. Cl.² ................ G03C 5/00; C23F 1/02; G03C 5/50; B32B 31/28
[52] U.S. Cl. ........................... 430/321; 156/659.1; 156/656; 156/666.1; 427/164; 427/165; 427/250; 427/255; 427/259
[58] Field of Search .............. 96/38.3, 38.4, 38.1, 96/38.2, 36, 36.1, 36.2; 156/659, 656, 661; 427/164, 165, 250, 255, 259

[56] References Cited

U.S. PATENT DOCUMENTS

| | | | |
|---|---|---|---|
| 3,615,462 | 10/1971 | Szegho et al. | 96/36.1 |
| 3,661,580 | 5/1972 | Mayaud | 96/36.1 |
| 3,669,665 | 6/1972 | Faigenbaum et al. | 96/36 |
| 3,712,816 | 1/1973 | Blome et al. | 96/38.3 |
| 3,745,094 | 7/1973 | Greene | 96/36 X |
| 3,878,007 | 4/1975 | Feldstein et al. | 156/11 |
| 4,018,938 | 4/1977 | Feder et al. | 96/38.3 X |

*Primary Examiner*—Edward C. Kimlin
*Assistant Examiner*—Alfonso T. Suro Pico
*Attorney, Agent, or Firm*—David M. Bunnell

[57] ABSTRACT

A negative exposure mask is prepared by forming a positive mask image of a first metal layer on a transparent substrate and applying a layer of resist which is exposed through the back of the substrate and developed to form a lift-off mask. The lift-off mask is used to form a negative mask image of a second layer of metal on the substrate in the areas not covered by the first metal layer. The first metal layer is then etched away to leave the negative mask image on the substrate.

8 Claims, 6 Drawing Figures

METHOD OF MAKING A NEGATIVE EXPOSURE MASK

BACKGROUND OF THE INVENTION

The invention relates to a method of making a negative exposure mask in which a pattern of masking material is formed on a transparent substrate.

Masks of this type are used in the lithographic transfer of patterns in semiconductor technology. The lithographic transfer of patterns has been developed because the integrated circuits require patterns with extremely small dimensions and tolerances. All types of the lithographic pattern transfer need a radiation source and a mask for modulating the radiation in such a manner that the respective pattern is transferred to a substrate which is coated with a resist material that is sensitive with respect to the radiation.

In view of the precision and fine details which are needed for generating this photoresist pattern in semiconductor technology, highest demands are made on the manufacture of the process masks involved, particularly with respect to high image fidelity. Formerly, the process masks were made substantially in accordance with a subtractive or an additive method. In the substractive method (direct mask production) a positive-working photoresist layer was applied onto a glass plate coated with an approx. 500–1000 Å thick metal layer, which positive-working photoresist layer was then exposed through an original with negative mask motifs, e.g., via an optical system or by maintaining a defined distance between original and photoresist layer, and subsequently developed. The metal not covered by the photoresist was etched off, and, after the removal of the photoresist, the thus made mask was applied to its use.

In the additive process (lift-off method) the metal was vapor-deposited after the photoresist process. In detail, a cleaned glass plate was coated with a positive-working photoresist, and using an original with positive mask motifs, the resist layer was exposed and subsequently developed. Then, metal was vapor-deposited on the glass plate and the photoresist islands, and the photoresist islands with the metal layer covering them were removed in a lift-off process. After additional cleaning the mask was applied to its use.

The disadvantages are that in both processes, the substractive as well as the additive one, the photoresist layer is exposed in accordance with the shadow masking process, with a defined distance between mask and photoresist layer being maintained. In this kind of exposure there can be a diffraction at the mask, and the resulting "exposure sub-structure" is highly undesirable when patterns of smaller and smaller geometry and greater fineness of details are to be imaged. Another disadvantage of the subtractive process described above is that, for making rectangular geometries, originals with negative rectangular mask motifs are less suited than originals with positive rectangular mask motifs, because for diffraction-geometrical reasons, behind negative and positive mask motifs of equal size there is different photoresist structure, and for the respective photoresist structure, with equal size, the geometry of the positive mask motif can be made larger (i.e., with the diffraction effect being smaller) than when a negative mask motif is used. Negative rectangles made in accordance with the subtractive process show for these reasons strongly rounded-off edges which with smaller geometries and decreasing ratio between the height of the mask material and the width of the narrowest mask motif (the aspect ratio) can even result in a circular shape.

The above specified disadvantages are avoided in the additive process where originals with positive mask motifs are employed, but thin photoresist layers have to be used to achieve a high image fidelity. The use of thin resist layers has the disadvantage that the photoresist islands produced therefrom and the metal layer coating, are quite difficult to lift off from the substrate.

BRIEF SUMMARY OF THE INVENTION

It is, therefore, the object of the invention to provide a process for making masks with negative rectangular geometries which show a high image fidelity, and which avoids the disadvantages of the above described methods.

The object of the invention is achieved by a process of the above specified type which is characterized in that a positive mask of the required geometry, and consisting of a first layer of metal, is produced in accordance with known lithographic processes on the substrate. A positive photoresist layer is then applied to the substrate on the mask side and exposed through the substrate with the positive mask. The exposed areas of the resist are dissolved with an aqueous alkaline developer and a second layer of metal is vapor-deposited on the surface of the substrate and the photoresist image. The photoresist image with its covering layer of metal is removed in a lift-off process and the positive mask of the first layer of metal is etched with an etchant until there remains on the substrate a negative mask of the second layer metal of the required geometry.

The negative masks made in accordance with the invention show a high image fidelity also for smaller and smaller dimensions. This is due to the fact that the exposure of the process as disclosed by the invention represents an optimum contact exposure method. In that respect the process as disclosed by the invention is superior to the conventional processes. Due to the high image fidelity the negative masks made in accordance with the invention can be transferred more easily to semiconductor components. If different patterns are imaged one over the other, a high integration density is possible due to the better defined overlapping zones, and furthermore, better electrical values for the monolithic components can be achieved.

DETAILED DESCRIPTION

For carrying out the process as disclosed by the invention the following conditions have to be fulfilled:

1. The masking materials used, which can consist of metals or metal oxides, have to be impermeable to UV light. It is furthermore necessary that they are selectively etchable if they have the same layer thickness, or if they consist of one and the same masking material they have a differing layer thickness so that after etching there always remains a layer of sufficient thickness.

2. In order to present favorable conditions for the lift-off process the photoresist layer should be as thick as possible, for instance a layer thickness greater than 1 μ should be provided. This ensures a clean tear-off edge of the photoresist in the lift-off process. By means of a suitable process step, e.g., by baking after exposure a resist slope of maximum steepness can be achieved.

The invention will be described in detail by means of an enbodiment illustrated in FIGS. 1 and 2.

Figure 1A:
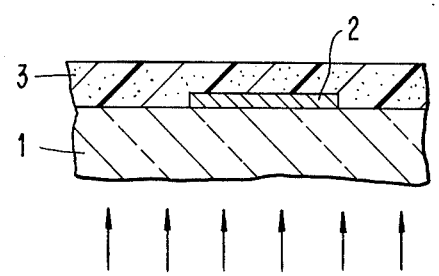
FIGS. 1A–1E are crossectional views illustrating the successive steps in preparing a mask in accordance with the process of the invention.
Figure 1B:
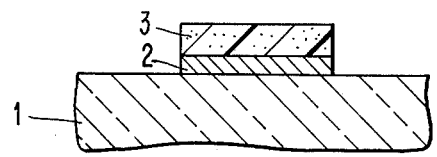

FIG. 1A shows the first steps for making a mask in accordance with the invention. Onto a polished, plane parallel transparent disk 1 made of quartz or glass, a metal layer 2 consisting of a metal as chromium, molybdenum, or aluminum is applied, e.g., by means of vapor deposition or sputtering, in a layer thickness of approx. 1000 Å for making the positive mask of a first metal I. For producing the positive mask with rectangular or square geometry of metal layer 2, a photoresist technique is applied. Subsequently, a positive-working photoresist layer 3 is applied to substrate 1 on the mask side in a layer thickness of approx. 1 μm. The photoresist layer can be, for instance, a polymer-sensitizer compound of a phenol-formaldehyde resin with a diazonaphthoquinone sensitizer which is identified as mixed 2-diazo-1-oxo-naphthalene-5-sulfonic acid esters of 2,3,4-trihydroxybenzophenone. This structure is pre-baked by a heating process for approximately 30 minutes to approximately 80° C. The structure shown in FIG. 1A is then exposed by means of UV radiation, e.g., with the light of a high pressure mercury lamp, through substrate 1. The exposure time is selected in accordance with the light source used. In the embodiment of the invention it is 23 sec. After exposure, the structure of FIG. 1A is developed into the intermediate product shown in FIG. 1B. The developer used is an aqueous alkaline developer containing sodium metasilicate and sodium hydrogen phosphate. The developing time is approximately 2 min. After developing and drying, the structure is post-baked in by heating for about 10 min. to a temperature of 140° C.

Figure 1C:
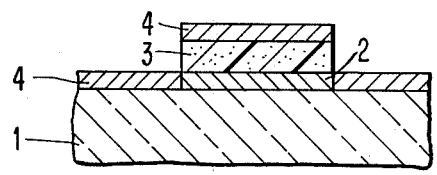
Figure 1D:
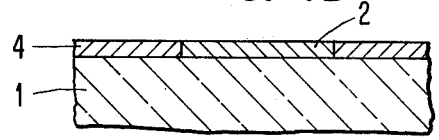

FIG. 1C shows the intermediate product after a layer 4 of a second metal II has been vapor-deposited onto the surface of substrate 1 and onto the surface of photoresist island 3. In the embodiment of the invention, if chromium is used for the positive mask, titanium as metal II is vapor-deposited in a layer thickness of approx. 1000 Å on the surfaces of substrate and photoresist. After the vapor-deposition of this mask layer 4, photoresist island 3 and the metal layer (FIG. 1C) covering it are removed by means of a lift-off process. For lifting off the photoresist an organic solvent, for instance methylcellosolve is used. The resulting structure is shown in FIG. 1D. The surface of the metal layer is then post-cleaned in a cleaning solution, for instance in an inorganic oxidizing acid.

If necessary, for repairing holes in the mask layer 4 of titanium, the surface of this mask layer and the surface of the positive mask of chromium are once more coated with photoresist. After exposure through substrate 1, where radiation impinges through the holes in mask layer 4 onto the photoresist and renders it soluble in these areas in an aqueous alkaline developer, and after a baking process the photoresist is developed in a known manner. Subsequently, titanium is again vapor-deposited, and the unexposed areas of the photoresist layer with their covering metal layer are removed by means of a lift-off process.

Figure 1E:
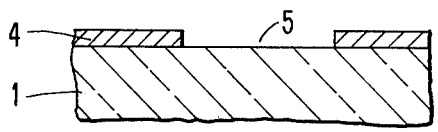

Finally, the structure of FIG. 1D is subjected to an etchant by means of which the positive mask, which in the embodiment of the invention consists of chromium, is removed. The resulting structure with mask opening 5 is shown in FIG. 1E. The etchant for chromium is, for example, an alkaline potassium permanganate solution. Altneratively, the chromium can also be removed by means of plasma etching. When choosing the etchant it should be made sure that it attacks only the positive mask of metal I, e.g., of chromium, and not the mask parts of metal II, e.g., of titanium. The finished negative mask can be used for making semiconductor components.

Figure 2:
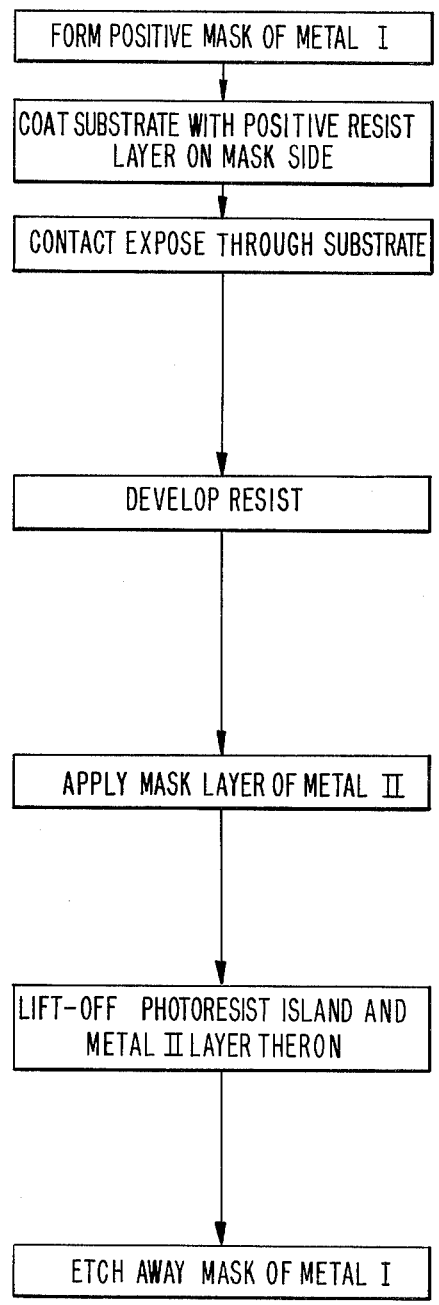
FIG. 2 is a flow diagram illustrating the steps of the process of the invention.

FIG. 2 shows in a flow diagram the various steps of the process as disclosed by the invention. Onto a substrate transparent to UV light a layer of metal I is applied, and a positive mask is made thereof by means of a photolithographic process. Then, a positive-working photoresist layer is applied on the mask side, which is exposed through the substrate. After exposure the resist is developed and a mask layer of metal II is applied on the surface of the substrate and that of the photoresist island over the positive mask of metal I. Then, the photoresist island and the metal layer covering it are removed. The steps of applying a positive-working resist layer, of exposure, and of applying a metal layer can be repeated when holes in the mask have to be repaired. By the removal of the positive mask of metal I in an etching step the process is closed. The negative mask made in accordance with the invention shows a high image fidelity.

We claim:

1. A method of making an exposure mask comprising:
    forming on a transparent substrate a positive pattern of masking material which is opaque to UV light, said material being selected from the group consisting of metals and inorganic metallic compounds,
    forming on said substrate and pattern a resist layer of positive photoresist,
    exposing said resist layer to UV light through the back of said substrate such that the portions of said resist layer in contact with the substrate are exposed,
    developing said resist layer so as to remove the exposed portions of said resist layer,
    depositing a second layer of masking material, which is opaque to UV light, on the substrate and on the remaining portions of the resist layer,
    removing the remaining portions of the resist layer and the overlying masking material, and
    removing the positive pattern of masking material to leave a negative pattern of said second layer of masking material on said substrate.

2. A method of making a negative exposure mask comprising:
    forming a positive mask of the required geometry of a first metal on a transparent substrate; applying a positive-working photoresist layer to the substrate on the mask side; exposing the layer through the substrate; dissolving the exposed areas of the resist with an aqueous alkaline developer; vapor depositing a second metal on the surface of substrate and the remaining photoresist; removing the remaining photoresist with its covering layer of the second metal in a lift-off process; and etching the positive mask of the first metal until there remains on the substrate a negative mask of said second metal of the required geometry.

3. The method of claim 2 wherein the first metal is chromium and the second metal is titanium.

4. The method of claim 2 wherein the masks are produced in a thickness of approx. 1000 Å.

5. The method of claim 3 wherein the etchant for the chromium is an alkaline potassium permanganate solution.

6. The method of claim 2 wherein the substrate is glass.

7. The method of claim 2 wherein the exposure of the photoresist is performed with UV light.

8. The method of claim 2 wherein prior to the steps of etching the positive mask, the process steps of resist coating, exposure, developing and vapor-deposition of the second metal and lift-off of the photoresist with its covering metal layer are repeated.

* * * * *